(12) United States Patent
Sheng

(10) Patent No.: US 12,046,895 B2
(45) Date of Patent: Jul. 23, 2024

(54) METHOD FOR WAFER-LEVEL ADJUSTMENT OF PROTECTION CIRCUITS OF ELECTRONIC DEVICES AND A WAFER FOR FACILITATING THE SAME

(71) Applicant: INNOSCIENCE (SUZHOU) SEMICONDUCTOR CO., LTD., Suzhou (CN)

(72) Inventor: Jianjian Sheng, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/787,946

(22) PCT Filed: Apr. 20, 2022

(86) PCT No.: PCT/CN2022/087905
§ 371 (c)(1),
(2) Date: Jun. 22, 2022

(87) PCT Pub. No.: WO2023/201567
PCT Pub. Date: Oct. 26, 2023

(65) Prior Publication Data
US 2024/0170957 A1    May 23, 2024

(51) Int. Cl.
  *H02H 9/04* (2006.01)
(52) U.S. Cl.
  CPC .................... *H02H 9/046* (2013.01)
(58) Field of Classification Search
  CPC ..................................................... H02H 9/046
  (Continued)

(56) References Cited

U.S. PATENT DOCUMENTS 11,699,899 B2 *  7/2023  Liao ............... H01L 27/0266
                                               361/56
11,715,946 B2 *  8/2023  Guan ............... H02H 9/046
                                               361/56
(Continued)

FOREIGN PATENT DOCUMENTS

CN    1674275 A    9/2005
CN  104113323 A   10/2014
(Continued)

OTHER PUBLICATIONS

International Search Report and Written Opinion of the corresponding PCT application No. PCT/CN2022/087905 dated Dec. 15, 2022.

*Primary Examiner* — Dharti H Patel
(74) *Attorney, Agent, or Firm* — Li & Cai Intellectual Property (USA) Office

(57) ABSTRACT

A method for wafer-level adjustment of protection circuits of electronic devices and a wafer for facilitating the same are provided. The method comprises: fabricating an adjustable terminal protection circuit for each of the electronic devices in the wafer; and adjusting each of the adjustable terminal protection circuits by cutting off one or more fuse elements in the one or more trimming circuits of the terminal protection circuit. The method provides a cost-effective approach to allow wafer-level on-chip adjustment of protection circuits for III-V compound devices in a flexible manner so as to address the issues of manufacturing process constrains under requirement of large wafer dimension.

18 Claims, 12 Drawing Sheets

(58) Field of Classification Search
USPC .......................................................... 361/56
See application file for complete search history.

(56) References Cited

U.S. PATENT DOCUMENTS

| | | | |
|---|---|---|---|
| 11,791,627 B2* | 10/2023 | Jiang | ...................... H02H 9/046 |
| | | | 361/56 |
| 2018/0026029 A1* | 1/2018 | Lin | ......................... H01L 28/20 |
| | | | 361/56 |
| 2019/0237456 A1* | 8/2019 | Lai | .................. H03K 17/08104 |
| 2021/0249404 A1* | 8/2021 | Lai | ......................... H02H 9/046 |
| 2022/0068414 A1 | 3/2022 | Katakura | |
| 2022/0376494 A1* | 11/2022 | Guan | .................. H01L 27/0266 |
| 2023/0155375 A1* | 5/2023 | Lee | ..................... H01L 27/0266 |
| | | | 361/56 |
| 2023/0198252 A1* | 6/2023 | Mizan | .................... H02H 9/046 |
| | | | 361/56 |

FOREIGN PATENT DOCUMENTS

| | | | | |
|---|---|---|---|---|
| CN | 107689369 A | | 2/2018 | |
| CN | 110137172 A | | 8/2019 | |
| CN | 112154541 A | * | 12/2020 | ......... H01L 27/0248 |
| CN | 112740498 A | * | 4/2021 | ............. H02H 9/046 |
| CN | 114301044 A | * | 4/2022 | ............. H02H 9/046 |
| CN | 116647214 A | * | 8/2023 | ............. H02H 9/046 |
| CN | 117393558 A | * | 1/2024 | ............. H02H 9/046 |

\* cited by examiner

METHOD FOR WAFER-LEVEL ADJUSTMENT OF PROTECTION CIRCUITS OF ELECTRONIC DEVICES AND A WAFER FOR FACILITATING THE SAME

FIELD OF THE INVENTION

The present invention generally relates to wafer-level adjustment of protection circuits for electronic devices. More specifically, the present invention relates to wafer-level on-chip adjustment of protection circuits for III-V compound semiconductor devices.

BACKGROUND OF THE INVENTION

Wide-bandgap material, such as III-V compound have been widely used for high-power and high-frequency devices because of low on-resistance, small device size, low power losses and fast switching transition. For example, gallium nitride (GaN) high-electron-mobility transistor (HEMT) has been widely used in making primary components in fast chargers for mobile devices. Due to the special device structure and working principle of GaN HEMT, gate of GaN HEMT is vulnerable to high voltage damages such as electrostatic discharges (ESD), terminal protection circuit as shown in FIG. 1 is used to ensure reliability of the device. Due to manufacturing process constrains and increasing in the wafer dimension, across-wafer uniformity of device characteristic is difficult to control, which makes it unviable to have a protection circuit design catering for all devices in a compound wafer.

SUMMARY OF THE INVENTION

One objective of the present invention is to provide a cost-effective approach to allow wafer-level on-chip adjustment of protection circuits for III-V compound devices in a flexible manner so as to address the above-said issues of manufacturing process constrains under requirement of large wafer dimension.

In according with one aspect of the present disclosure, a method for wafer-level adjustment of protection circuits of electronic devices in a wafer is provided. The method comprises: fabricating an adjustable terminal protection circuit for each of the electronic devices in the wafer, wherein the adjustable terminal protection circuit including: one or more trimming circuits configured for adjusting the adjustable terminal protection circuit; and adjusting each of the adjustable terminal protection circuits by cutting off one or more fuse elements in the one or more trimming circuits of the terminal protection circuit.

In according with another aspect of the present disclosure, a semiconductor wafer comprising a plurality of adjustable electronic devices is provided. Each adjustable electronic device comprises: a control terminal Ctrl; a first conduction terminal Cdct1; a second conduction terminal Cdct2; a primary component having a control electrode connected to the control terminal Ctrl, a first conduction electrode connected to the first conduction terminal Cdct1 and a second conduction electrode connected to the second conduction terminal Cdct2; and an adjustable terminal protection circuit configured for protecting the primary component. The adjustable terminal protection circuit includes: one or more current sampling elements connected in series between an interconnection node and the second conduction terminal Cdct2; one or more clamping elements connected in series between the control terminal Ctrl and the interconnection node; one or more discharge elements, each having a control electrode connected to the interconnection node, a first conduction electrode connected to the control terminal Ctrl and a second conduction electrode connected to the second conduction terminal Cdct2; and one or more trimming circuits, each configured for adjusting the adjustable terminal protection circuit.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. For simplicity, common reference numerals may be used throughout the drawings and the detailed description to indicate the same or similar components.

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1:
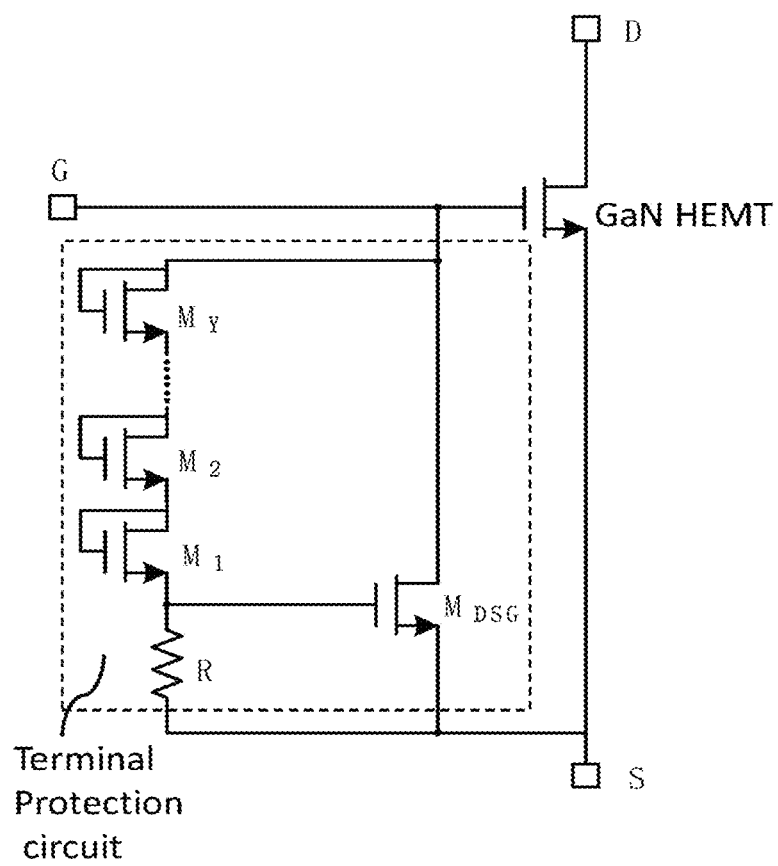
FIG. 1 shows a circuit diagram for an electronic device implemented with a conventional terminal protection circuit.
Figure 2:
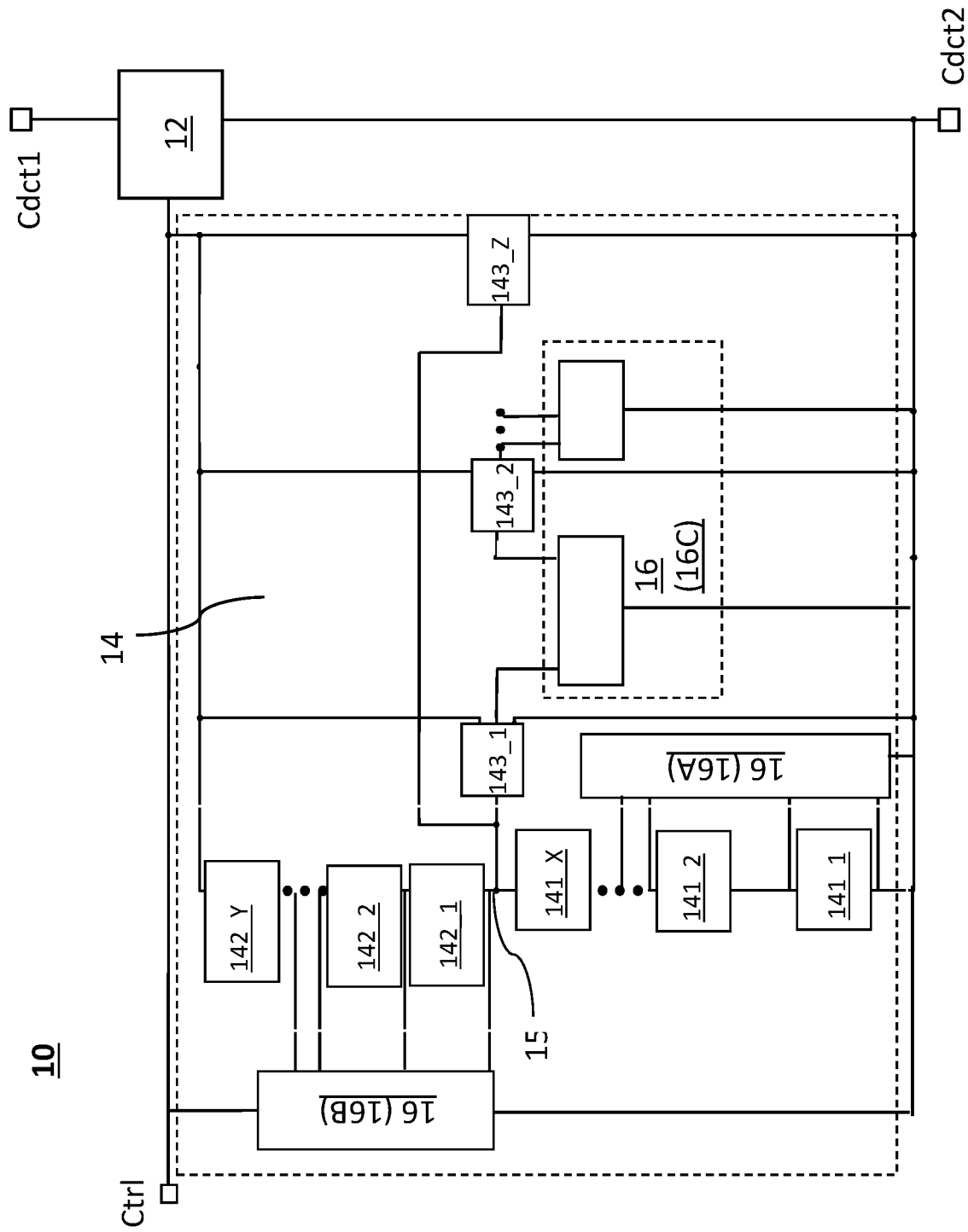
FIG. 2 shows a circuit block diagram of an electronic device in a wafer before circuit adjustment according to some embodiments of the present invention.

FIG. 2 shows a circuit block diagram of an electronic device in a wafer for facilitating wafer-level adjustment of protection circuits of electronic devices according to some embodiments of the present invention. As shown in FIG. 2, the electronic device 10 may comprise a control terminal Ctrl; a conduction terminal Cdct1; a conduction terminal Cdct2; a primary component 12, an adjustable terminal protection circuit 14.

The primary component 12 may have a control electrode connected to the control terminal Ctrl, a first conduction electrode connected to the first conduction terminal Cdct1 and a second conduction electrode connected to the second conduction terminal Cdct2.

The adjustable terminal protection circuit 14 may include one or more current sampling elements, 141_1, 141_2, ..., 141_X, where X is the number of current sampling elements, connected in series between an interconnection node 15 and the second conduction terminal Cdct2. The current sampling elements may include a first current sampling element 141_1 having one end connected to the interconnection node 15 and a last current sampling element 141_X having one end connected to the second conduction terminal Cdct2.

The adjustable terminal protection circuit 14 may further include one or more clamping elements, 142_1, 142_2, ..., 142_Y, where Y is the number of clamping elements, connected in series between the control terminal Ctrl and the interconnection node 15. Each of the clamping elements 142_1, 142_2, ..., 142_Y may have an anode and a cathode. The clamping elements may include a first clamping element 142_1 having a cathode connected to the interconnection node 15 and a last clamping element 142_Y having an anode connected to the control terminal Ctrl.

The terminal protection circuit 14 may further include one or more discharge elements 143_1, 143_2, ..., 143_Z, where Z is the number of discharge elements. Each discharge element may have a control electrode connected to the interconnection node 15, a first conduction electrode connected to the control terminal Ctrl and a second conduction electrode connected to the second conduction terminal Cdct2.

The adjustable terminal protection circuit 14 may further include one or more trimming circuits 16. Each of the trimming circuits 16 may be configured for activating or deactivating one of the current sampling elements (e.g. 141_1), clamping elements (e.g. 142_1) or discharge elements (e.g. 143_2).

More specifically, the trimming circuits 16 may include at least one current sampling trimming circuit 16A including one or more current sampling element activation circuit configured for activating a corresponding current sampling element; and/or one or more current sampling element deactivation circuit configured for deactivating a corresponding current sampling element. The trimming circuits 16 may further include at least one clamping trimming circuit 16B including one or more clamping element activation circuit configured for activating a corresponding clamping element; and/or one or more clamping element deactivation circuit configured for deactivating a corresponding clamping element. The trimming circuits 16 may further include at least one discharge trimming circuit 16C including one or more discharge element activation circuit configured for activating a corresponding discharge element; and/or one or more discharge element deactivation circuit configured for deactivating a corresponding discharge element.

Figure 3:
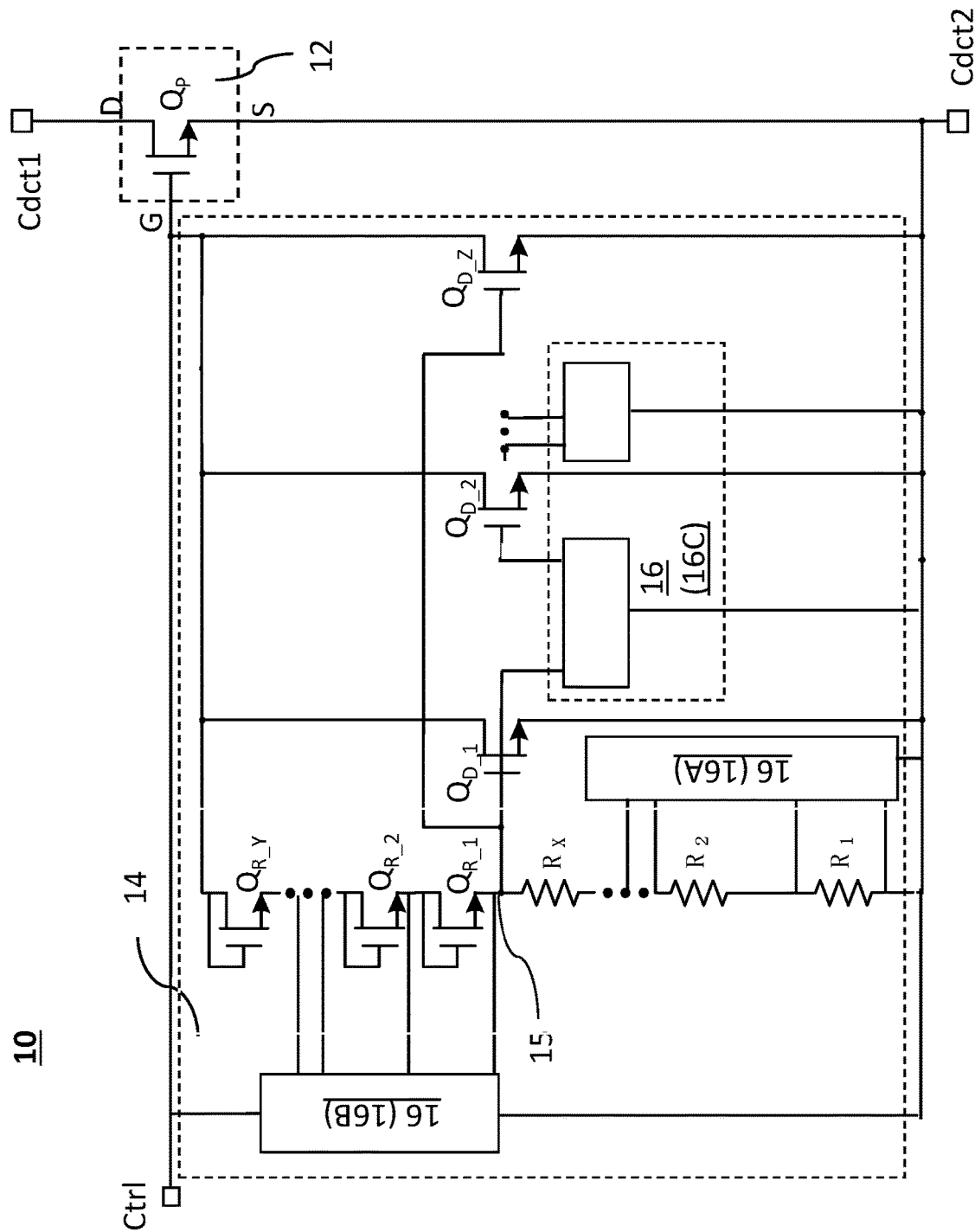
FIG. 3 is a circuit diagram showing exemplary current sampling elements, clamping elements and discharge elements of an electronic device according to some embodiments of the present invention.

Referring to FIG. 3. The primary component 12 may be a power transistor $Q_P$ having a gate G acting as the control electrode of the primary component, a drain D acting as the first conduction electrode of the primary component and a source S acting as the second conduction electrode of the primary component. In some embodiments, the primary component 12 may be a horizontal/transverse high-electron-mobility transistor (HEMT). In some embodiments, the primary component 12 may include an arbitrary quantity of power transistors or any other power circuits.

The current sampling elements 141_1, 141_2, ..., 141_X may be formed of resistors $R_1, R_2, ..., R_X$, respectively. The resistors $R_1, R_2, ..., R_X$ may be connected in series between the interconnection node 15 and the second conduction terminal Cdct2. The resistors $R_1, R_2, ..., R_X$ may include a first resistor $R_1$ having one end connected to the second conduction terminal Cdct2 and a last resistor $R_X$ having one end connected to the interconnection node 15.

The clamping elements 142_1, 142_2, ..., 142_Y may be formed of transistors $Q_{R\_1}, Q_{R\_2}, ..., Q_{R\_Y}$, respectively. Each of the transistors $Q_{R\_1}, Q_{R\_2}, ..., Q_{R\_Y}$ may have a source and a gate electrically shorted together to act as an anode of a corresponding clamping element and a drain to act as a cathode of the corresponding clamping element. The transistors $Q_{R\_1}, Q_{R\_2}, ..., Q_{R\_Y}$ may be connected in series between the control terminal Ctrl and the interconnection node 15. The transistors $Q_{R\_1}, Q_{R\_2}, ..., Q_{R\_Y}$ may include a first transistor $Q_{R\_1}$ having its drain connected to the interconnection node 15 and a last transistor $Q_{R\_Y}$ having its gate and source connected to the control terminal Ctrl. In some embodiments, each of the transistors $Q_{R\_1}, Q_{R\_2}, ..., Q_{R\_Y}$ may be a horizontal/transverse high-electron-mobility transistor (HEMT). In some embodiments, each of the transistors $Q_{R\_1}, Q_{R\_2}, ..., Q_{R\_Y}$ may be replaced with a diode. The diodes are connected in series between the control terminal Ctrl and the interconnection node 15.

The discharge elements 143_1, 143_2, ..., 143_Z may be formed of transistors $Q_{D\_1}, Q_{D\_2}, ..., Q_{D\_Z}$ respectively. Each of the transistors $Q_{D\_1}, Q_{D\_2}, ..., Q_{D\_Z}$ may have a gate G acting as the control electrode of a corresponding discharge element, a drain D acting as the first conduction electrode of the corresponding discharge element and a source S acting as the second conduction electrode of the corresponding discharge element. In some embodiments, each of the transistors $Q_{D\_1}, Q_{D\_2}, ..., Q_{D\_Z}$ may be a horizontal/transverse high-electron-mobility transistor (HEMT).

Figure 4:
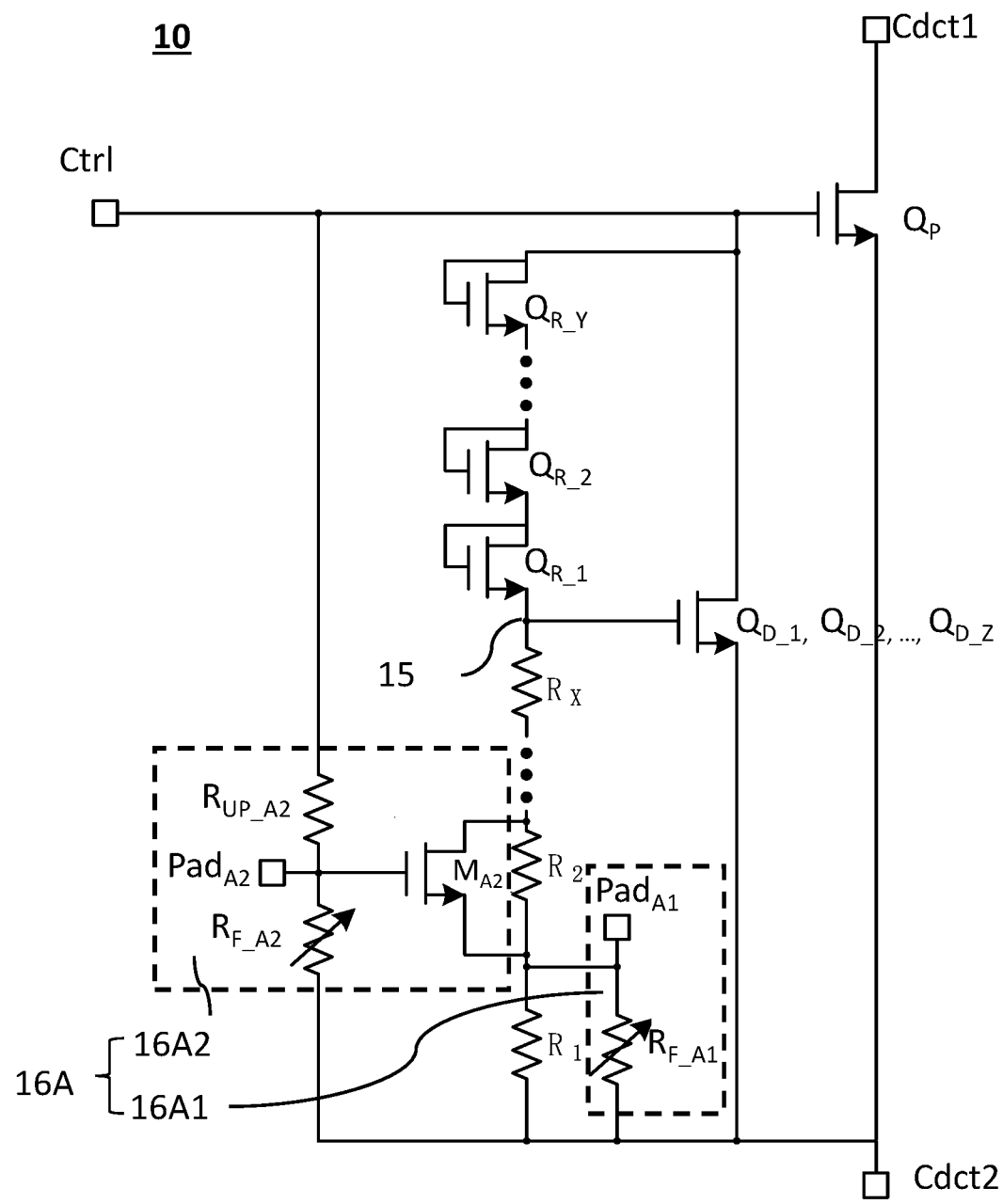
FIG. 4 is a circuit diagram showing how an exemplary current sampling trimming circuit is implemented in the electronic device according to some embodiments of the present invention.

FIG. 4 is a circuit diagram showing how a current sampling trimming circuit 16A is implemented in the electronic device 10 according to some embodiments of the present invention. For simplicity, only one of the discharge elements is illustrated. As shown, the current sampling trimming circuit 16A may comprise a current sampling element activation circuit 16A1 and a current sampling element deactivation circuit 16A2.

The current sampling element activation circuit 16A1 may include a fuse element $R_{F\_A1}$ connected in parallel with the corresponding current sampling element $R_1$. The fuse element $R_{F\_A1}$ has a first end connected to a first current sampling trimming pad $Pad_{A1\_1}$ and a second end connected to a second current sampling trimming pad $Pad_{A1\_2}$.

The current sampling element deactivation circuit 16A2 may include: a controllable switching element $M_{A2}$ connected in parallel with the corresponding current sampling element $R_2$; a pulling-up resistive element $R_{UP\_A2}$ connected between the control terminal Ctrl and a control electrode of the controllable switching element $M_{A2}$; and a pulling-down fuse element $R_{F\_A2}$ connected between the control electrode of the controllable switching element $M_{A2}$ and the second conduction terminal Cdct2. The pulling-down fuse element $R_{F\_A2}$ may have a first end connected to a current sampling trimming pad $Pad_{A2}$ and a second end connected to the second conduction terminal Cdct2 which functions as another current sampling trimming pad for the fuse element $R_{F\_A2}$.

The fuse element $R_{F\_A1}$ may have a resistance much smaller than that of the corresponding current sampling element $R_1$. Under a default state where the fuse element $R_{F\_A1}$ is not cut off, the current sampling element $R_1$ is short-circuited (or by-passed) by the fuse element $R_{F\_A1}$. The current sampling element $R_1$ does not function to form a part of the overall current sampling resistance of the terminal protection circuit. When the fuse element $R_{F\_A1}$ is cut off, the current sampling element $R_1$ is no longer short-circuited by the fuse element $R_{F\_A1}$. The current sampling element $R_1$ is "activated" to form a part of the overall current sampling resistance of the terminal protection circuit. In other words, the overall current sampling resistance of the terminal protection circuit can be increased by cutting off the fuse element $R_{F\_A1}$.

The pulling-down fuse element $R_{F\_A2}$ may have a resistance much smaller than that of the pulling-up resistive element $R_{UP\_A2}$ and the switching element $M_{A2}$ may have an on-resistance much smaller than the resistance of the corresponding current sampling element $R_2$. Under a default state where the fuse element $R_{F\_A2}$ is not cut off, the voltage at the control electrode of the switching element $M_{A2}$ is pulled down to the second control terminal Cdct2 through the fuse element $R_{F\_A2}$. The switching element $M_{A2}$ is turned off. The current sampling element $R_2$ functions to form a part of the overall current sampling resistance of the terminal protection circuit. When the fuse element $R_{F\_A2}$ is cut off, the voltage at the control electrode of the switching element $M_{A2}$ is pulled up to the control terminal Ctrl through the pulling-up resistive element $R_{UP\_A2}$. The switching element $M_{A2}$ is turned on to short-circuit the current sampling element $R_2$. The current sampling element $R_2$ is then "deactivated" from forming a part of the overall current sampling resistance of the terminal protection circuit. In other words, the overall current sampling resistance of the terminal protection circuit can be decreased by cutting off the fuse element $R_{F\_A2}$.

Therefore, the current sampling element activation circuit 16A1 and current sampling element deactivation circuit 16A2 can be used together to adjust the overall current sampling resistance of the terminal protection circuit. If the measured overall current sampling resistance of the terminal protection circuit is lower than a target value, the fuse element $R_{F\_A1}$ can be cut off to activate the corresponding current sampling element $R_1$ so as to increase the overall current sampling resistance of the terminal protection circuit. If the measured overall current sampling resistance of the terminal protection circuit is higher than the target value, the fuse element $R_{F\_A2}$ can be cut off to deactivate the corresponding current sampling element $R_2$ so as to decrease the overall current sampling resistance of the terminal protection circuit.

Figure 5:
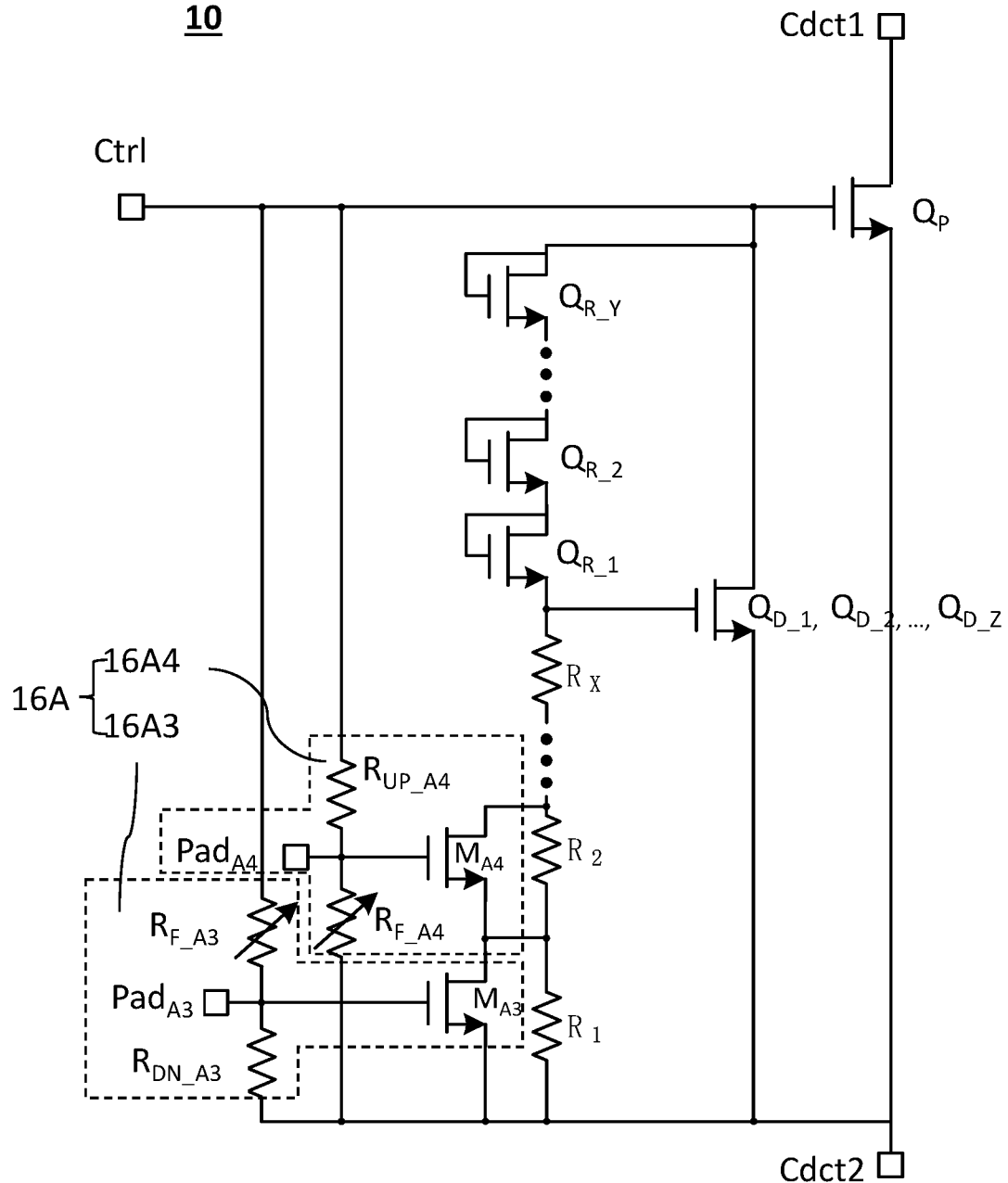
FIG. 5 is a circuit diagram showing how another exemplary current sampling trimming circuit is implemented in the electronic device according to some embodiments of the present invention.

FIG. 5 is a circuit diagram showing how a current sampling trimming circuit 16A is implemented in the electronic device 10 according to some embodiments of the present invention. For simplicity, only one of the discharge elements is illustrated. As shown, the current sampling trimming circuit 16A may comprise a current sampling element activation circuit 16A3 and a current sampling element deactivation circuit 16A4.

The current sampling element activation circuit 16A3 may include: a controllable switching element $M_{A3}$ connected in parallel with a corresponding current sampling element $R_1$; a pulling-up fuse element $R_{F\_A3}$ connected between the control terminal Ctrl and a control electrode of the controllable switching element $M_{A3}$; and a pulling-down resistive element $R_{DN\_A3}$ connected between the control electrode of the controllable switching element $M_{A3}$ and the second conduction terminal Cdct2. The pulling-up fuse element $R_{F\_A3}$ may have a first end connected to a current sampling trimming pad $Pad_{A3}$ and a second end connected to the control terminal Ctrl which functions as another current sampling trimming pad for the pulling-down fuse element $R_{F\_A3}$.

The current sampling element deactivation circuit 16A4 may include: a controllable switching element $M_{A4}$ connected in parallel with a corresponding current sampling element $R_2$; a pulling-up resistive element $R_{F\_A4}$ connected between the control terminal Ctrl and a control electrode of the controllable switching element $M_{A4}$; and a pulling-down fuse element $R_{F\_A4}$ connected between the control electrode of the controllable switching element $M_{A4}$ and the second conduction terminal Cdct2. The pulling-down fuse element $R_{F\_A4}$ may have a first end connected to a current sampling trimming pad $Pad_{A4}$ and a second end connected to the second conduction terminal Cdct2 which functions as another current sampling trimming pad for the pulling-down fuse element $R_{F\_A4}$.

The pulling-up fuse element $R_{F\_A3}$ may have a resistance much smaller than that of the pulling-down resistive element $R_{DN\_A3}$ and the switching element $M_{A3}$ may have an on-resistance much smaller than the resistance of the corresponding current sampling element $R_1$. Under a default condition where the fuse element $R_{F\_A3}$ is not cut off, the voltage at the control electrode of the switching element $M_{A3}$ is pulled up to the control terminal Ctrl through the fuse element $R_{F\_A3}$. The switching element $M_{A3}$ is turned on. The current sampling element $R_1$ is short-circuited and does not function to form a part of the overall current sampling resistance of the terminal protection circuit. When the fuse element $R_{F\_A3}$ is cut off, the voltage at the control electrode of the switching element $M_{A3}$ is pulled down to the second conduction terminal Cdct2 through the pulling-down resistive element $R_{DN\_A3}$. The switching element $M_{A3}$ is turned off. The current sampling element $R_1$ is no longer short-circuited by the fuse element $R_{F\_A3}$. The current sampling element $R_1$ is then "activated" to form a part of the overall current sampling resistance of the terminal protection circuit. In other words, the overall current sampling resistance of the terminal protection circuit can be increased by cutting off the fuse element $R_{F\_A3}$.

The pulling-down fuse element $R_{F\_A4}$ may have a resistance much smaller than that of the pulling-up resistive element $R_{UP\_A4}$ and the switching element $M_{A4}$ may have an on-resistance much smaller than the resistance of the corresponding current sampling element $R_2$. Under a default condition where the fuse element $R_{F\_A4}$ is not cut off, the voltage at the control electrode of the switching element $M_{A4}$ is pulled down to the second conduction terminal Cdct2 through the fuse element $R_{F\_A4}$. The switching element $M_{A4}$ is turned off and the current sampling element $R_2$ functions to form a part of the overall current sampling resistance of the terminal protection circuit. When the fuse element $R_{F\_A4}$ is cut off, the voltage at the control electrode of the switching element $M_{A4}$ is pulled up to the control terminal Ctrl through the pulling-up resistive element $R_{UP\_A4}$. The switching element $M_{A4}$ is turned on to short-circuit the current sampling element $R_2$. The current sampling element $R_2$ is then "deactivated" from forming a part of the overall current sampling resistance of the terminal protection circuit. In other words, the overall current sampling resistance of the terminal protection circuit can be decreased by cutting off the fuse element $R_{F\_A4}$.

Therefore, the current sampling element activation circuit 16A3 and current sampling element deactivation circuit 16A4 can be used together to adjust an overall current sampling resistance of the terminal protection circuit. If a measured overall current sampling resistance of the terminal protection circuit is lower than a target value, the fuse element $R_{F\_A3}$ can be cut off to activate the corresponding current sampling element $R_1$ so as to increase the overall current sampling resistance of the terminal protection circuit. If the measured overall current sampling resistance of the terminal protection circuit is higher than the target value, the fuse element $R_{F\_A4}$ can be cut off to deactivate the corresponding current sampling element $R_2$ so as to decrease the overall current sampling resistance of the terminal protection circuit.

Figure 6:
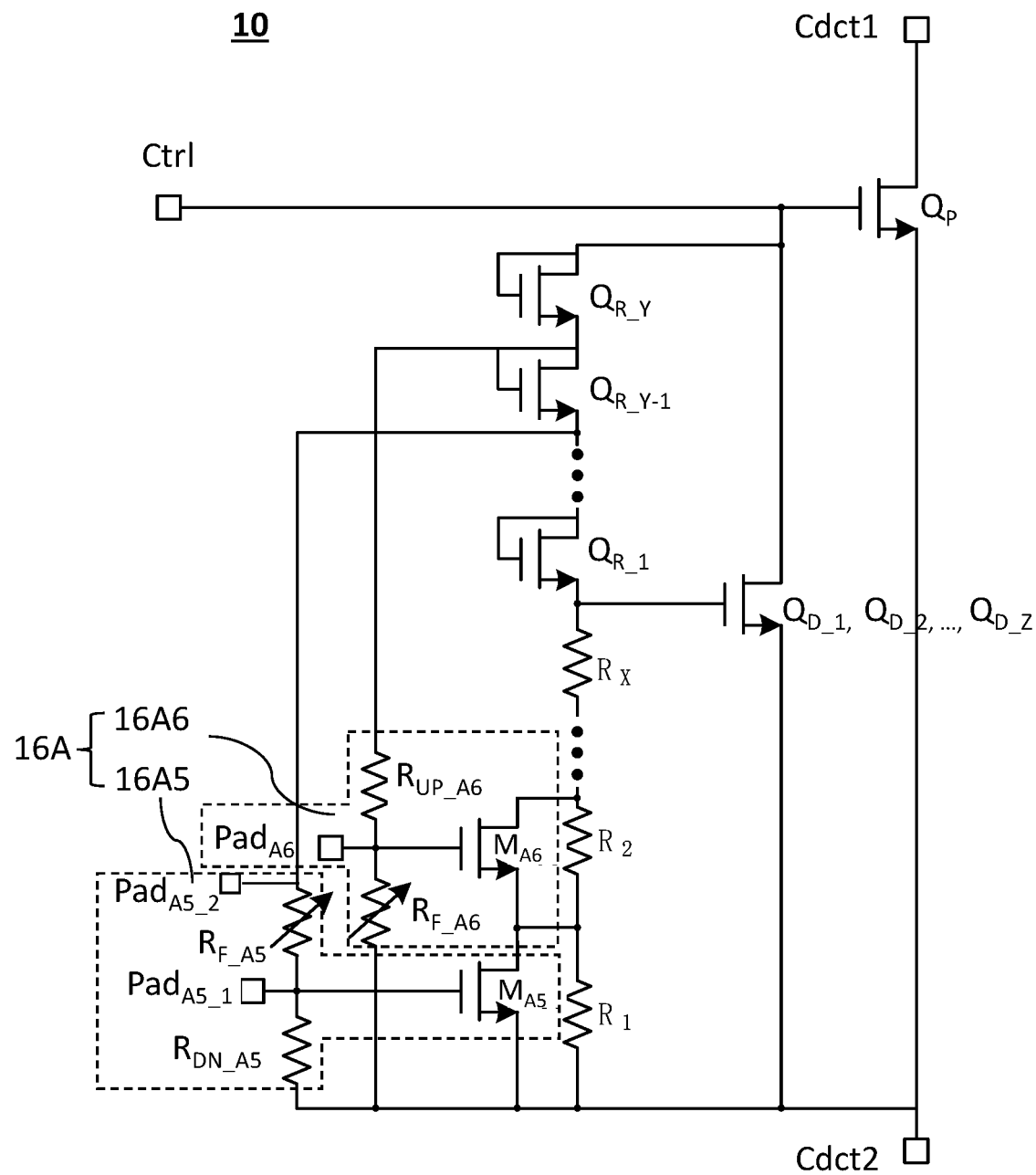
FIG. 6 is a circuit diagram showing how another exemplary current sampling trimming circuit is implemented in the electronic device according to some embodiments of the present invention.

FIG. 6 is a circuit diagram showing how a current sampling trimming circuit 16A is implemented in the electronic device 10 according to some embodiments of the present invention. For simplicity, only one of the discharge elements is illustrated. As shown, the current sampling trimming circuit 16A may comprise a current sampling element activation circuit 16A5 and a current sampling element deactivation circuit 16A6.

The current sampling element activation circuit 16A5 may include: a controllable switching element $M_{A5}$ connected in parallel with a corresponding current sampling element $R_1$; a pulling-up fuse element $R_{F\_A5}$ connected between a cathode (or drain) of a clamping element $Q_{R\_Y-1}$ and a control electrode of the controllable switching element $M_{A5}$; and a pulling-down resistive element $R_{DN\_A5}$ connected between the control electrode of the controllable switching element $M_{A5}$ and the second conduction terminal Cdct2. The pulling-up fuse element $R_{F\_A5}$ may have a first end connected to a first current sampling trimming pad $Pad_{A5\_1}$ and a second end connected to a second current sampling trimming pad $Pad_{A5\_2}$.

The current sampling element deactivation circuit 16A6 may include: a controllable switching element $M_{A6}$ connected in parallel with a corresponding current sampling element $R_2$; a pulling-up resistive element $R_{F\_A6}$ connected between a cathode (or drain) of a clamping element $Q_{R\_Y}$ and a control electrode of the controllable switching element $M_{A6}$; and a pulling-down fuse element $R_{F\_A6}$ connected between the control electrode of the controllable switching element $M_{A6}$ and the second conduction terminal Cdct2. The pulling-down fuse element $R_{F\_A6}$ may have a first end connected to a current sampling trimming pad $Pad_{A6}$ and a second end connected to the second conduction terminal Cdct2 which functions as another current sampling trimming pad for the pulling-down fuse element $R_{F\_A6}$.

The pulling-up fuse element $R_{F\_A5}$ may have a resistance much smaller than that of the pulling-down resistive element $R_{DN\_A5}$ and the switching element $M_{A5}$ may have an on-resistance much smaller than the resistance of the corresponding current sampling element $R_1$. Under a default condition where the fuse element $R_{F\_A5}$ is not cut off, the voltage at the control electrode of the switching element $M_{A5}$ is pulled up to the drain of the clamping element $Q_{R\_Y-1}$ through the fuse element $R_{F\_A5}$. The switching element $M_{A5}$ is turned on. The current sampling element $R_1$ is short-circuited by the switching element MAs and does not function to form a part of the overall current sampling resistance of the terminal protection circuit. When the fuse element $R_{F\_A5}$ is cut off, the voltage at the control electrode of the switching element $M_{A5}$ is pulled down to the second conduction terminal Cdct2 through the pulling-down resistive element $R_{DN\_A5}$. The switching element $M_{A6}$ is turned off. The current sampling element $R_1$ is no longer short-circuited by the fuse element $R_{F\_A5}$. The current sampling element $R_1$ is then "activated" to form a part of the overall current sampling resistance of the terminal protection circuit. In other words, the overall current sampling resistance of the terminal protection circuit can be increased by cutting off the fuse element $R_{F\_A5}$.

The pulling-down fuse element $R_{F\_A6}$ may have a resistance much smaller than that of the pulling-up resistive element $R_{UP\_A6}$ and the switching element $M_{A6}$ may have an on-resistance much smaller than the resistance of the corresponding current sampling element $R_2$. Under a default condition where the fuse element $R_{F\_A6}$ is not cut off, the voltage at the control electrode of the switching element $M_{A6}$ is pulled down to the second conduction terminal Cdct2 through the fuse element $R_{F\_A6}$. The switching element $M_{A6}$ is turned off and the current sampling element $R_2$ functions to form a part of the overall current sampling resistance of the terminal protection circuit. When the fuse element $R_{F\_A6}$ is cut off, the voltage at the control electrode of the switching element $M_{A6}$ is pulled up to the drain of the clamping element $Q_{R\_Y}$ through the pulling-up resistive element $R_{UP\_A6}$. The switching element $M_{A6}$ is turned on to short-circuit the current sampling element $R_2$. The current sampling element $R_2$ is then "deactivated" from forming a part of the overall current sampling resistance of the terminal protection circuit. In other words, the overall current sampling resistance of the terminal protection circuit can be decreased by cutting off the fuse element $R_{F\_A6}$.

Therefore, the current sampling element activation circuit 16A5 and current sampling element deactivation circuit 16A6 can be used together to adjust an overall current sampling resistance of the terminal protection circuit. If a measured overall current sampling resistance of the terminal protection circuit is lower than a target value, the fuse element $R_{F\_A5}$ can be cut off to activate the corresponding current sampling element $R_1$ so as to increase the overall current sampling resistance of the terminal protection circuit. If the measured overall current sampling resistance of the terminal protection circuit is higher than the target value, the fuse element $R_{F\_A6}$ can be cut off to deactivate the corresponding current sampling element $R_2$ so as to decrease the overall current sampling resistance of the terminal protection circuit.

Figure 7:
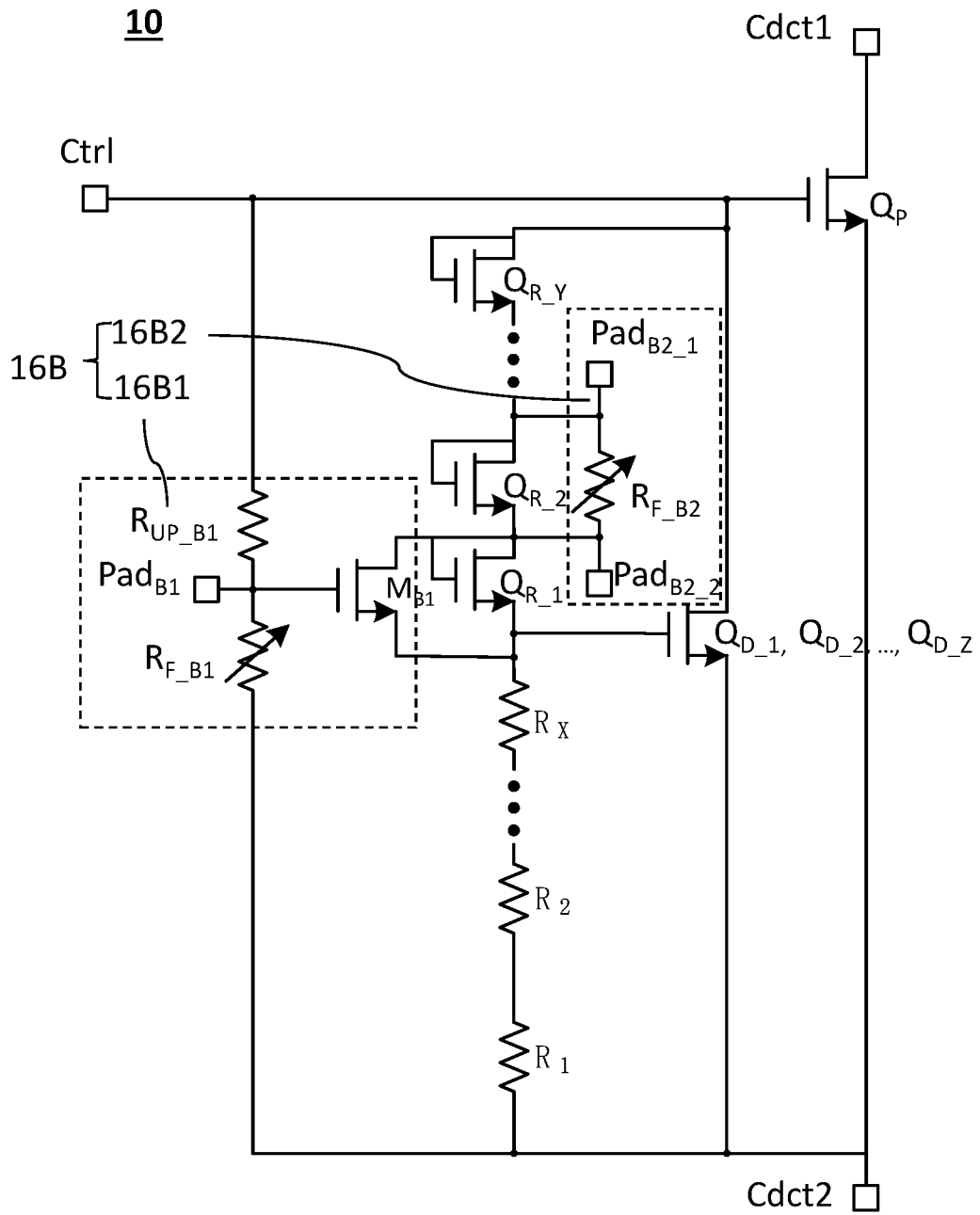
FIG. 7 is a circuit diagram showing how an exemplary clamping trimming circuit is implemented in the electronic device according to some embodiments of the present invention.

FIG. 7 is a circuit diagram showing how a clamping trimming circuit 16B is implemented in the electronic device 10 according to some embodiments of the present invention. For simplicity, only one of the discharge elements is illustrated. As shown, the clamping trimming circuit 16B may comprise a clamping element deactivation circuit 16B1 and a clamping element activation circuit 16B2.

The clamping element deactivation circuit 16B1 may include: a controllable switching element $M_{B1}$ connected in parallel with a corresponding clamping element $Q_{R\_1}$; a pulling-up resistive element $R_{UP\_B1}$ connected between the control terminal Ctrl and a control electrode of the controllable switching element $M_{B1}$; and a pulling-down fuse element $R_{F\_B1}$ connected between the control electrode of the controllable switching element $M_{B1}$ and the second conduction terminal Cdct2. The pulling-down fuse element $R_{F\_B1}$ may have a first end connected to a clamping trimming pad $Pad_{B1}$ and a second end connected to the second conduction terminal Cdct2 which functions as another clamping trimming pad for the fuse element $R_{F\_B1}$.

The clamping element activation circuit 16B2 may include a fuse element $R_{F\_B2}$ connected in parallel with a corresponding clamping element $Q_{R\_2}$. The fuse element $R_{F\_B2}$ has a first end connected to a first clamping trimming pad $Pad_{B2\_1}$ and a second end connected to a second clamping trimming pad $Pad_{B2\_2}$.

The fuse element $R_{F\_B1}$ may have a resistance much smaller than that of the pulling-up resistive element $R_{UP\_B1}$ and the switching element $M_{B1}$ may have an on-resistance much smaller than the resistance of the corresponding clamping element $Q_{R\_1}$. Under a default state where the fuse element $R_{F\_B1}$ is not cut off, the voltage at the control electrode of the switching element $M_{B1}$ is pulled down to the second control terminal Cdct2 through the fuse element $R_{F\_B1}$. The switching element $M_{B1}$ is turned off. The clamping element $Q_{R\_1}$ functions to form a part of the overall clamping voltage provided by the terminal protection circuit. When the fuse element $R_{F\_B1}$ is cut off, the voltage at the control electrode of the switching element $M_{B1}$ is pulled up to the control terminal Ctrl through the pulling-up resistive element $R_{UP\_B1}$. The switching element $M_{B1}$ is turned on to short-circuit the clamping element $Q_{R\_1}$. The clamping element $Q_{R\_1}$ is then "deactivated" from forming a part of the overall clamping voltage provided by the terminal protection circuit. In other words, the overall clamping voltage provided by the terminal protection circuit can be decreased by cutting off the fuse element $R_{F\_B1}$.

The fuse element $R_{F\_B2}$ may have a resistance much smaller than that of the corresponding clamping element $Q_{R\_2}$. Under a default state where the fuse element $R_{F\_B2}$ is not cut off, the clamping element $Q_{R\_2}$ is short-circuited (or by-passed) by the fuse element $R_{F\_B2}$. The clamping element $Q_{R\_2}$ does not function to form a part of the overall clamping voltage of the electronic device. When the fuse element $R_{F\_B2}$ is cut off, the clamping element $Q_{R\_2}$ is no longer short-circuited by the fuse element $R_{F\_B2}$ The clamping element $Q_{R\_2}$ is "activated" to form a part of the overall clamping voltage provided by the terminal protection circuit. In other words, the clamping voltage provided by the terminal protection circuit can be increased by cutting off the fuse element $R_{F\_B2}$.

Therefore, the clamping element deactivation circuit 16B1 and clamping element activation circuit 16B2 can be used together to adjust the overall clamping voltage provided by the terminal protection circuit. If the measured overall clamping voltage provided by the terminal protection circuit is higher than a target value, the fuse element $R_{F\_B1}$ can be cut off to deactivate the corresponding clamping element $Q_{R\_1}$ so as to decrease the overall clamping voltage provided by the terminal protection circuit. If the measured overall clamping voltage provided by the terminal protection circuit is lower than the target value, the fuse element $R_{F\_B2}$ can be cut off to activate the corresponding clamping element $Q_{R\_2}$ so as to increase the overall clamping voltage provided by the terminal protection circuit.

Figure 8:
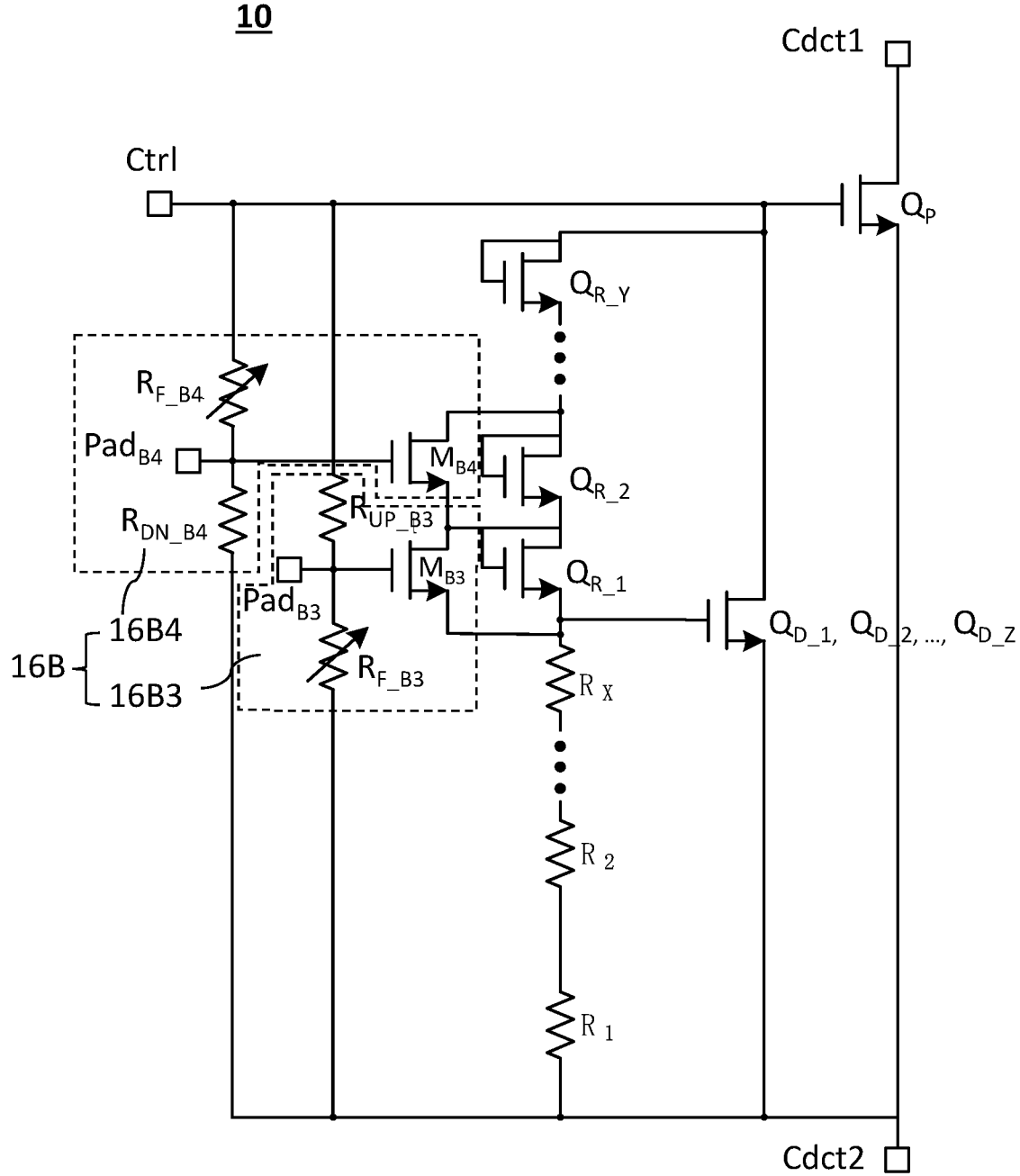
FIG. 8 is a circuit diagram showing how another exemplary clamping trimming circuit is implemented in the electronic device according to some embodiments of the present invention.

FIG. 8 is a circuit diagram showing how a clamping trimming circuit 16B is implemented in the electronic device 10 according to some embodiments of the present invention. For simplicity, only one of the discharge elements is illustrated. As shown, the clamping trimming circuit 16B may comprise a clamping element deactivation circuit 16B3 and a clamping element activation circuit 16B4.

The clamping element deactivation circuit 16B3 may include: a controllable switching element $M_{B3}$ connected in parallel with a corresponding clamping element $Q_{R\_1}$; a pulling-up resistive element $R_{UP\_B3}$ connected between the control terminal Ctrl and a control electrode of the controllable switching element $M_{B3}$; and a pulling-down fuse element $R_{F\_B3}$ connected between the control electrode of the controllable switching element $M_{B3}$ and the second conduction terminal Cdct2. The pulling-down fuse element $R_{F\_B3}$ may have a first end connected to a clamping trimming pad $Pad_{B3}$ and a second end connected to the second conduction terminal Cdct2 which functions as another clamping trimming pad for the fuse element $R_{F\_B3}$.

The clamping element activation circuit 16B4 may include: a controllable switching element $M_{B4}$ connected in parallel with a corresponding clamping element $Q_{R\_2}$; a pulling-up fuse element $R_{F\_B4}$ connected between the control terminal Ctrl and a control electrode of the controllable switching element $M_{B4}$; and a pulling-down resistive element $R_{DN\_B4}$ connected between the control electrode of the controllable switching element $M_{B4}$ and the second conduction terminal Cdct2. The pulling-up fuse element $R_{F\_B4}$ may have a first end connected to a clamping trimming pad $Pad_{B4}$ and a second end connected to the control terminal Ctrl which functions as another clamping trimming pad for the fuse element $R_{F\_B4}$.

The fuse element $R_{F\_B3}$ may have a resistance much smaller than that of the pulling-up resistive element $R_{UP\_B3}$ and the switching element $M_{B3}$ may have an on-resistance much smaller than the resistance of the corresponding clamping element $Q_{R\_1}$. Under a default state where the fuse element $R_{F\_B3}$ is not cut off, the voltage at the control electrode of the switching element $M_{B3}$ is pulled down to the second control terminal Cdct2 through the fuse element $R_{F\_B3}$. The switching element $M_{B3}$ is turned off. The clamping element $Q_{R\_1}$ functions to form a part of the overall clamping voltage provided by the terminal protection circuit. When the fuse element $R_{F\_B3}$ is cut off, the voltage at the control electrode of the switching element $M_{B3}$ is pulled up to the control terminal Ctrl through the pulling-up resistive element $R_{UP\_B3}$. The switching element $M_{B3}$ is turned on to short-circuit the clamping element $Q_{R\_1}$. The clamping element $Q_{R\_1}$ is then "deactivated" from forming a part of the overall clamping voltage provided by the terminal protection circuit. In other words, the overall clamping voltage provided by the terminal protection circuit can be decreased by cutting off the fuse element $R_{F\_B3}$.

The fuse element $R_{F\_B4}$ may have a resistance much smaller than that of the pulling-up resistive element $R_{UP\_B4}$ and the switching element $M_{B4}$ may have an on-resistance much smaller than the resistance of the corresponding clamping element $Q_{R\_2}$. Under a default state where the fuse element $R_{F\_B4}$ is not cut off, the voltage at the control electrode of the switching element $M_{B4}$ is pulled up to the control terminal Ctrl through the fuse element $R_{F\_B4}$. The switching element $M_{B4}$ is turned on. The clamping element $Q_{R\_2}$ is short-circuited and does not function to form a part of the overall clamping voltage provided by the terminal protection circuit. When the fuse element $R_{F\_B4}$ is cut off, the voltage at the control electrode of the switching element $M_{B4}$ is pulled down to the second conduction terminal Cdct2 through the pulling-down resistive element $R_{DN\_B4}$. The switching element $M_{B4}$ is turned off. The clamping element $Q_{R\_2}$ is no longer short-circuited by the fuse element $R_{F\_B4}$. The clamping element $Q_{R\_2}$ is then "activated" to form a part of the overall clamping voltage provided by the terminal protection circuit. In other words, the overall clamping voltage provided by the terminal protection circuit can be increased by cutting off the fuse element $R_{F\_B4}$.

Therefore, the clamping element deactivation circuit 16B3 and clamping element activation circuit 16B4 can be used together to adjust the overall clamping voltage provided by the terminal protection circuit. If the measured overall clamping voltage provided by the terminal protection circuit is higher than a target value, the fuse element $R_{F\_B3}$ can be cut off to deactivate the corresponding clamping element $Q_{R\_1}$ so as to decrease the overall clamping voltage provided by the terminal protection circuit. If the measured overall clamping voltage provided by the terminal protection circuit is lower than the target value, the fuse element $R_{F\_B4}$ can be cut off to activate the corresponding clamping element $Q_{R\_2}$ so as to increase the overall clamping voltage provided by the terminal protection circuit.

Figure 9:
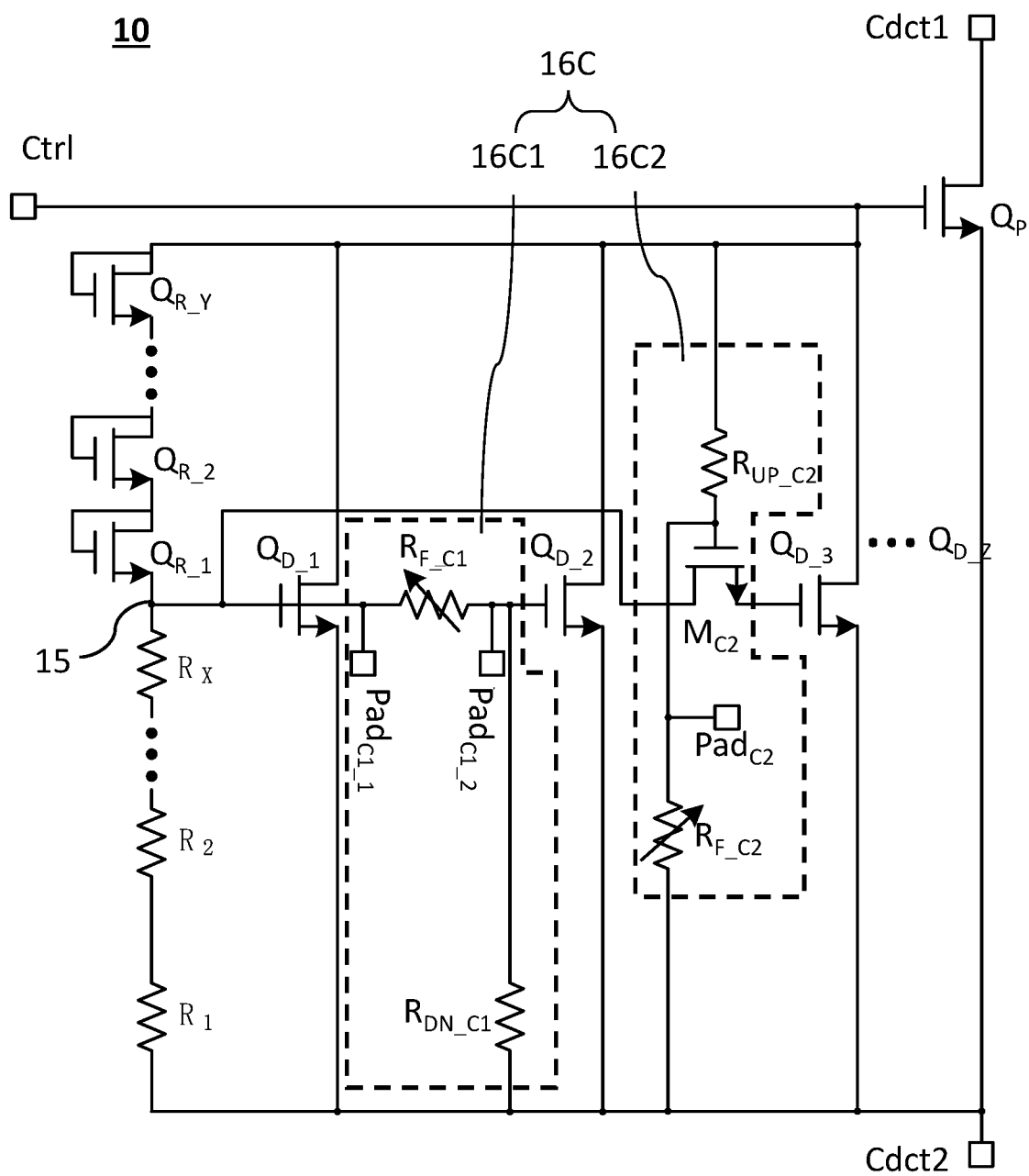
FIG. 9 is a circuit diagram showing how an exemplary discharge trimming circuit is implemented in the electronic device according to some embodiments of the present invention.

FIG. 9 is a circuit diagram showing how a discharge trimming circuit 16C is implemented in the electronic device 10 according to some embodiments of the present invention. As shown, the discharge trimming circuit 16C may comprise a discharge element deactivation circuit 16C1 and a discharge element activation circuit 16C2.

The discharge element deactivation circuit 16C1 may include a fuse element $R_{F\_C1}$ connected between the interconnection node 15 and a control electrode of a corresponding discharge element $Q_{D\_2}$; and a pulling-down resistive element $R_{DN\_C1}$ connected between the control electrode of the corresponding discharge element $Q_{D\_2}$ and the second conduction terminal Cdct2. The fuse element $R_{F\_C1}$ has a first end connected to a first discharge trimming pad $Pad_{C1\_1}$ and a second end connected to a second discharge trimming pad $Pad_{C1\_2}$.

The clamping element activation circuit 16C2 may include: a controllable switching element $M_{C2}$ connected between the interconnection node 15 and a control electrode of a corresponding clamping element $Q_{D\_3}$; a pulling-up resistive element $R_{UP\_C2}$ connected between the control terminal Ctrl and a control electrode of the controllable switching element $M_{C2}$; and a pulling-down fuse element $R_{F\_C2}$ connected between the control electrode of the controllable switching element $M_{C2}$ and the second conduction terminal Cdct2. The pulling-down fuse element $R_{F\_C2}$ may have a first end connected to a clamping trimming pad $Pad_{C2}$ and a second end connected to the second conduction terminal Cdct2 which functions as another clamping trimming pad for the fuse element $R_{F\_C2}$.

The fuse element $R_{F\_C1}$ may have a resistance much smaller than that of the pulling-down resistive element $R_{DN\_C1}$. Under a default state where the fuse element $R_{F\_C1}$ is not cut off, the voltage at the control electrode of the discharge element $Q_{D\_2}$ is pulled-up to the interconnection node 15 through the fuse element $R_{F\_C1}$. The discharge element $Q_{D\_2}$ is turned on and functions to form a part of the overall discharge conductance (or capability) provided by the terminal protection circuit. When the fuse element $R_{F\_C1}$ is cut off, the voltage at the control electrode of the discharge element $Q_{D\_2}$ is pulled down to the second conduction terminal Cdct2 through the pulling-down resistive element $R_{DN\_C1}$. The discharge element $Q_{D\_2}$ is turned off and "deactivated" from forming a part of the overall discharge voltage provided by the terminal protection circuit. In other words, the overall discharge conductance provided by the terminal protection circuit can be decreased by cutting off the fuse element $R_{F\_C1}$.

The fuse element $R_{F\_C2}$ may have a resistance much smaller than that of the pulling-up resistive element $R_{UP\_C2}$. Under a default state where the fuse element $R_{F\_C2}$ is not cut off, the voltage at the control electrode of the switching element $M_{C2}$ is pulled down to the second conduction terminal Cdct2 through the fuse element $R_{F\_C2}$. The switching element $M_{C2}$ is turned off. The electrical conduction between the control electrode of the discharge element $Q_{D\_3}$ and the interconnection node 15 is blocked. The discharge element $Q_{D\_3}$ does not function to form a part of the overall discharge conductance provided by the terminal protection circuit. When the fuse element $R_{F\_C2}$ is cut off, the voltage at the control electrode of the switching element $M_{C2}$ is pulled up to the control terminal Ctrl through the pulling-up resistive element $R_{UP\_C2}$. The switching element $M_{C2}$ is turned on. The electrical conduction between the control electrode of the discharge element $Q_{D\_3}$ and the interconnection node 15 is no longer blocked. The discharge element $Q_{D\_3}$ is then "activated" to form a part of the overall discharge conductance provided by the terminal protection circuit. In other words, the overall discharge conductance provided by the terminal protection circuit can be increased by cutting off the fuse element $R_{F\_C2}$.

Therefore, the discharge element deactivation circuit 16C1 and discharge element activation circuit 16C2 can be used together to adjust the overall discharge conductance provided by the terminal protection circuit. If the measured overall discharge conductance provided by the terminal protection circuit is higher than a target value, the fuse element $R_{F\_C1}$ can be cut off to deactivate the corresponding discharge element $Q_{D\_2}$ so as to decrease the overall discharge conductance provided by the terminal protection circuit. If the measured overall discharge conductance provided by the terminal protection circuit is lower than the target value, the fuse element $R_{F\_C2}$ can be cut off to activate the corresponding discharge element $Q_{D\_3}$ so as to increase the overall discharge conductance provided by the terminal protection circuit.

Figure 10:
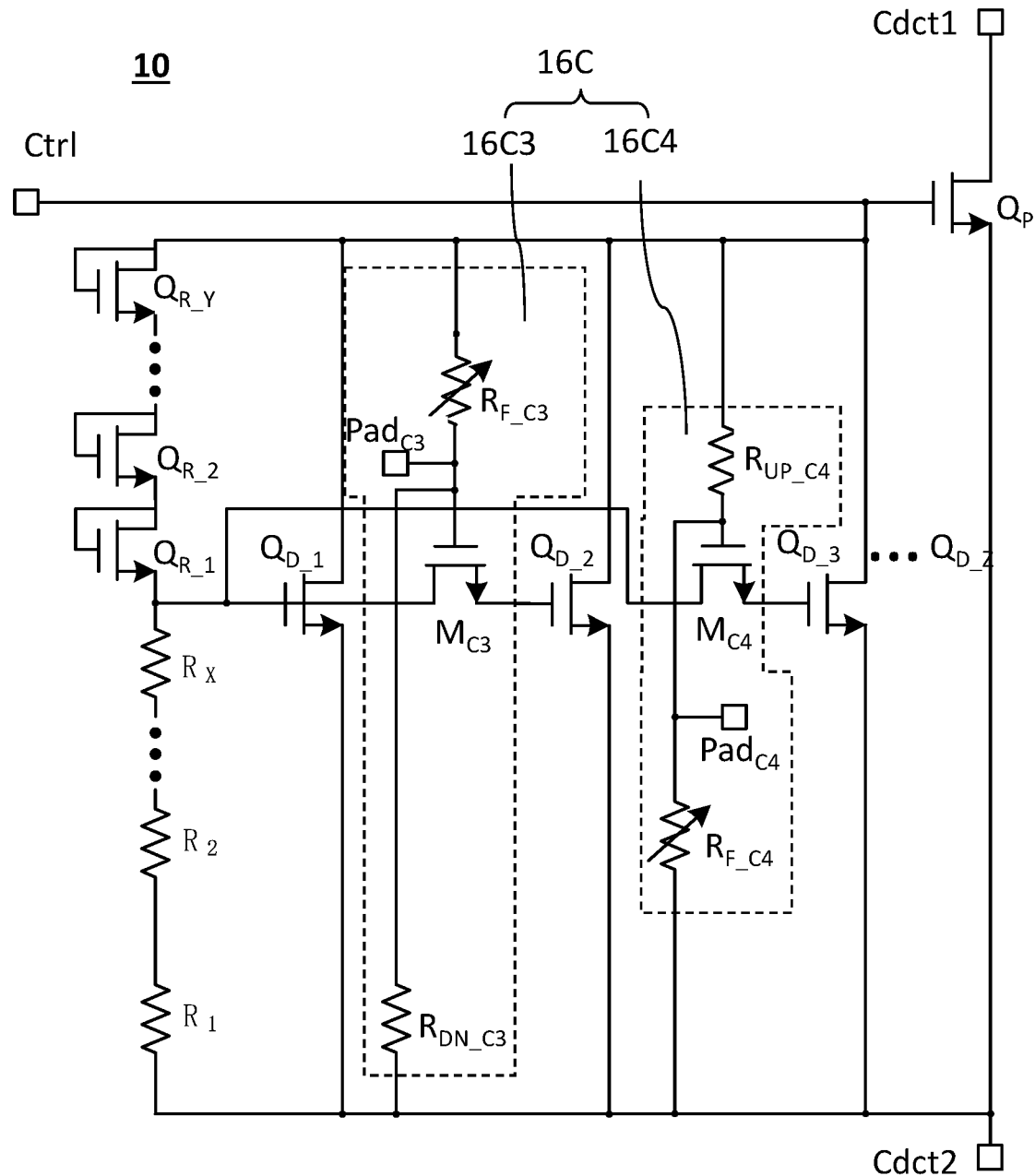
FIG. 10 is a circuit diagram showing how another exemplary discharge trimming circuit is implemented in the electronic device according to some embodiments of the present invention.

FIG. 10 is a circuit diagram showing how a discharge trimming circuit 16C is implemented in the electronic device 10 according to some embodiments of the present invention. As shown, the discharge trimming circuit 16C may comprise a discharge element deactivation circuit 16C3 and a discharge element activation circuit 16C4.

The discharge element deactivation circuit 16C3 may include: a controllable switching element $M_{C3}$ connected between the interconnection node 15 and a control electrode of a corresponding discharge element $Q_{D\_2}$; a pulling-up fuse element $R_{F\_C3}$ connected between the control terminal Ctrl and a control electrode of the controllable switching element $M_{C3}$; and a pulling-down resistive element $R_{DN\_C3}$ connected between the control electrode of the controllable switching element $M_{C3}$ and the second conduction terminal Cdct2. The pulling-up fuse element $R_{F\_C3}$ may have a first end connected to a first discharge trimming pad $Pad_{C3\_1}$ and a second end connected to a second discharge trimming pad $Pad_{C3\_2}$.

The discharge element activation circuit 16C4 may include: a controllable switching element $M_{C4}$ connected between the interconnection node 15 and a control electrode of a corresponding discharge element $Q_{D\_3}$; a pulling-up resistive element $R_{UP\_C4}$ connected between the control terminal Ctrl and a control electrode of the controllable switching element $M_{C4}$; and a pulling-down fuse element $R_{F\_C4}$ connected between the control electrode of the controllable switching element $M_{C4}$ and the second conduction terminal Cdct2. The pulling-down fuse element $R_{F\_C4}$ may have a first end connected to a discharge trimming pad $Pad_{C4}$ and a second end connected to the second conduction terminal Cdct2 which functions as another discharge trimming pad for the fuse element $R_{F\_C4}$.

The fuse element $R_{F\_C3}$ may have a resistance much smaller than that of the pulling-down resistive element $R_{DN\_C3}$. Under a default state where the fuse element $R_{F\_C3}$ is not cut off, the voltage at the control electrode of the switching element $M_{C3}$ is pulled up to the control terminal Ctrl through the fuse element $R_{F\_C3}$. The switching element $M_{C3}$ is turned on and allow electrical conduction between the control electrode of the discharge element $Q_{D\_2}$ and the interconnection node 15. The discharge element $Q_{D\_2}$ is turned on and functions to form a part of the overall discharge conductance provided by the terminal protection circuit. When the fuse element $R_{F\_C3}$ is cut off, the voltage at the control electrode of the switching element $M_{C3}$ is pulled down to the second conduction terminal Cdct2 through the pulling-down resistive element $R_{DN\_C3}$. The switching element $M_{C3}$ is turned off. The electrical conduction between the control electrode of the discharge element $Q_{D\_2}$ and the interconnection node 15 is blocked. The discharge element $Q_{D\_2}$ is turned off and "deactivated" from forming a part of the overall discharge conductance provided by the terminal protection circuit. In other words, the overall discharge conductance provided by the terminal protection circuit can be decreased by cutting off the fuse element $R_{F\_C3}$.

The fuse element $R_{F\_C4}$ may have a resistance much smaller than that of the pulling-up resistive element $R_{UP\_C4}$. Under a default state where the fuse element $R_{F\_C4}$ is not cut off, the voltage at the control electrode of the switching element $M_{C4}$ is pulled down to the second conduction terminal Cdct2 through the fuse element $R_{F\_C4}$. The switching element $M_{C4}$ is turned off to block the electrical conduction between the control electrode of the discharge element $Q_{D\_3}$ and the interconnection node 15. The discharge element $Q_{D\_3}$ does not function to form a part of the overall discharge conductance provided by the terminal protection circuit. When the fuse element $R_{F\_C4}$ is cut off, the voltage at the control electrode of the switching element $M_{C4}$ is pulled up to the control terminal Ctrl through the pulling-up resistive element $R_{UP\_C4}$. The switching element $M_{C4}$ is turned on. The electrical conduction between the control electrode of the discharge element $Q_{D\_3}$ and the interconnection node 15 is no longer blocked. The discharge element $Q_{D\_3}$ is then "activated" to form a part of the overall discharge conductance provided by the terminal protection circuit. In other words, the overall discharge conductance provided by the terminal protection circuit can be increased by cutting off the fuse element $R_{F\_C4}$.

Therefore, the discharge element deactivation circuit 16C3 and discharge element activation circuit 16C4 can be used together to adjust the overall discharge conductance provided by the terminal protection circuit. If the measured overall discharge conductance provided by the terminal protection circuit is higher than a target value, the fuse element $R_{F\_C3}$ can be cut off to deactivate the corresponding discharge element $Q_{D\_2}$ so as to decrease the overall discharge conductance provided by the terminal protection circuit. If the measured overall discharge conductance provided by the terminal protection circuit is lower than the target value, the fuse element $R_{F\_C4}$ can be cut off to activate the corresponding discharge element $Q_{D\_3}$ so as to increase the overall discharge conductance provided by the terminal protection circuit.

It should be appreciated that depending on design specifications, the adjustable terminal protection circuit according to the present invention may have various combination of the trimming circuits as illustrated in FIGS. 4-10.

Figure 11:
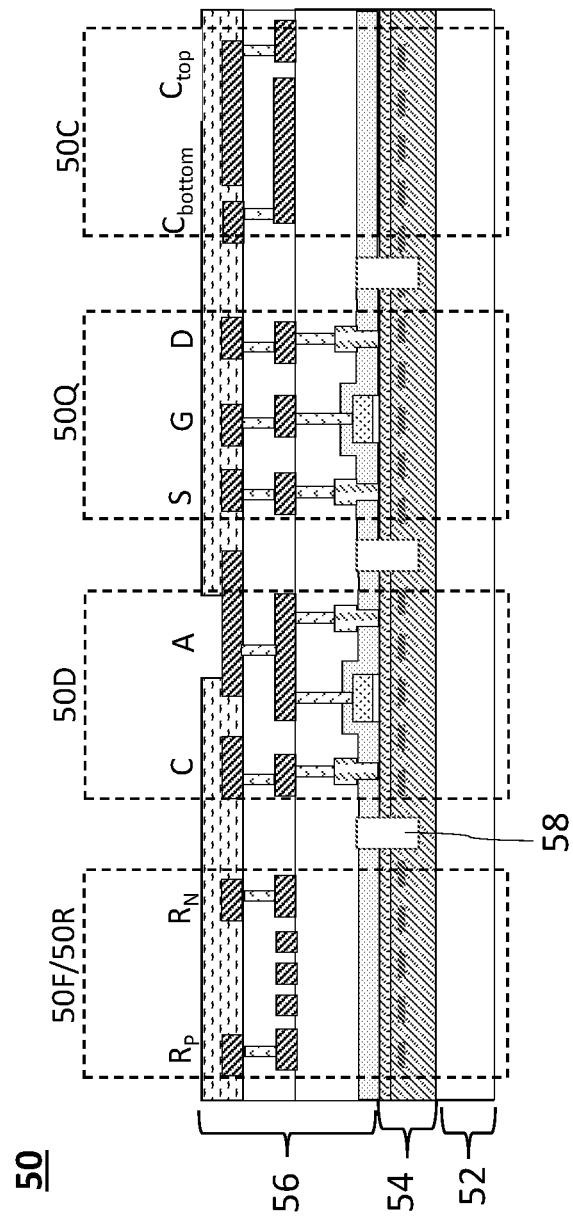
FIG. 11 shows a cross sectional view of an IC chip for forming the electronic device according to various embodiments of the present invention.

FIG. 11 shows a cross sectional view of an IC chip 50 for forming the electronic device according to various embodiments of the present invention. As shown, the IC chip 50 may include a substrate 52, an III-V layer structures 54 and conductor structures 56.

The substrate 52 may include, for example, but not limited to, silicon (Si), doped silicon (doped Si), silicon carbide (SiC), silicide germanium (SiGe), gallium arsenide (GaAs) or other semiconductor materials. The substrate 52 may include, for example, but not limited to, sapphire, silicon on insulator (SOI) or other proper materials. In some embodiments, the substrate 52 may also include a doped region (not shown), for example, a p-well and an n-well.

The III-V layer 54 may be arranged on the substrate 52. The III-V layer 54 may include, for example, but not limited to, gallium nitride (GaN), aluminum gallium nitride (AlGaN), indium gallium nitride (InGaN) and other III-V compounds. In some embodiments, the III-V layer 54 may include, for example, but not limited to, III nitrides, for example, compound $In_xAl_yGa_{1-x-y}N$ (wherein x+y≤1), compound $Al_yGa_{(1-y)}N$ (wherein y≤1). In some embodiments, the III-V layer 54 may include, for example, but not limited to, a p type dopant, an n type dopant or other dopants. In some embodiment, the III-V layer 54 may include a single-layer structure, a multi-layer structure and/or a heterostructure. The III-V layer 54 may have a heterojunction, and two-dimensional electron gas (2DEG) regions (not shown) are formed in the III-V layer 54 due to polarization of heterojunctions of different nitrides.

The conductor structure 56 is arranged on the III-V layer 54. The conductor structure 56 may include metals, for example, but not limited to, titanium (Ti), Tantalum (Ta), tungsten (W), aluminum (Al), cobalt (Co), cuprum (Cu), nickel (Ni), platinum (Pt), plumbum (Pb), molybdenum (Mo) and compounds (for example but not limited to, titanium nitride (TiN), tantalum nitride (TaN), other conductive nitrides or conductive oxides) thereof, metal alloys (for example aluminum copper alloy (Al—Cu)), or other proper materials.

The conductor structures 56 may form different components of the electronic devices according to various embodiments of the present invention, such as transistors 50Q, rectifier 50D, fuse/resistor 50F/50R and capacitor 50C. The electronic device 50 may also include an insulation region 58 isolating various components. The conductor structures 56 may include transistor gate G, transistor source S, transistor drain D, rectifier anode A, rectifier cathode C, capacitor terminals $C_{bottom}$ and $C_{top}$, resistor/fuse terminals $R_P$ and $R_N$, or other conductor structures.

In some embodiments, the capacitor 50C may be a metal-insulator-metal MIM capacitor. In some embodiments, the resistor 50R may be a 2DEG resistor. In some embodiments, the transistor 50Q and rectifier 50D may include high-electron-mobility transistors (HEMT), wherein the HEMT may include an enhancement mode HEMT (E-HEMT) and a depletion mode HEMT (d-HEMT).

In some embodiments, the fuse 50F can be made of any suitable conductive materials which can be removed by applying an electrical voltage or current through the trimming pads. For examples, the fuse elements may be made of polysilicon or metals including, but not limited to, titanium (Ti), Tantalum (Ta), tungsten (W), aluminum (Al), cobalt (Co), cuprum (Cu), nickel (Ni), platinum (Pt), plumbum (Pb), molybdenum (Mo) and compounds (for example but not limited to, titanium nitride (TiN), tantalum nitride (TaN), other conductive nitrides or conductive oxides) thereof, metal alloys (for example aluminum copper alloy (Al—Cu)), or other proper materials.

Although the conductor structures 56 and various components formed by the conductor structures 56 are described as being arranged at specific positions in FIG. 11, selection, configuration and quantity of the conductor structures 56 and various components can vary depending on design specifications.

In other embodiments, the electronic device 10 according to various embodiments of the present invention may be formed of discrete electronic devices. That is, the components in the electronic device 10 are each formed independently in a die. The discrete electronic devices are conducive to formation of integrated electronic devices. For example, the discrete electronic devices are further integrated with other devices, and/or a plurality of electronic devices are integrated with each other.

Figure 12:
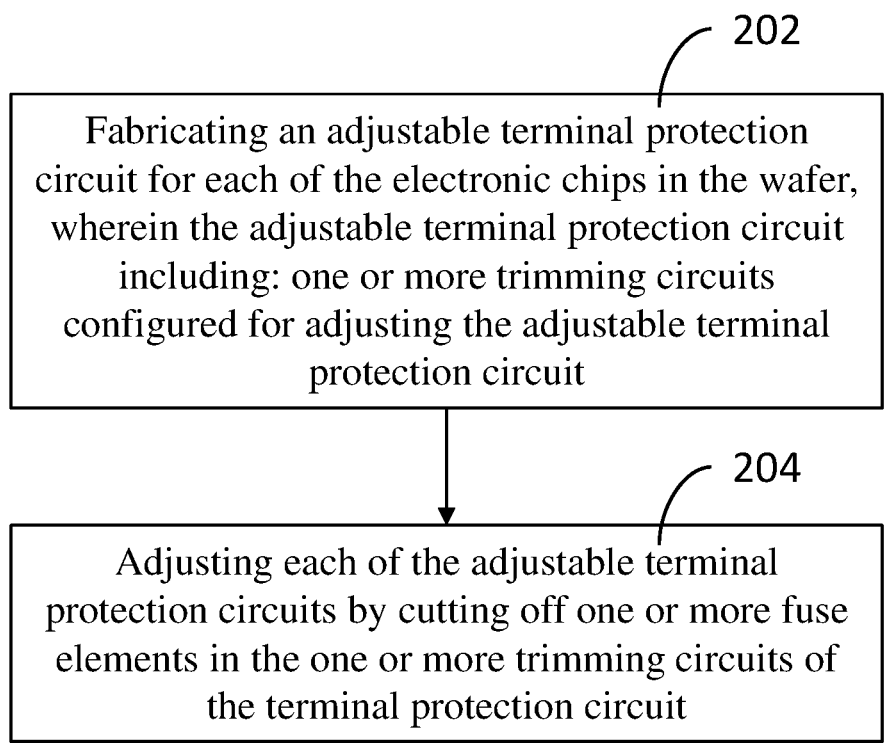
FIG. 12 shows a flowchart of a method for wafer-level adjustment of protection circuits of electronic devices in a wafer according to some embodiments of the present invention.

FIG. 12 shows a flowchart of a method for wafer-level adjustment of protection circuits of electronic devices in a wafer according to some embodiments of the present invention. Each electronic device chip may comprise a primary component and an adjustable terminal protection circuit as illustrated in FIG. 2.

As shown in FIG. 12, the method may comprise the following steps:

S202: fabricating an adjustable terminal protection circuit for each of the electronic devices in the wafer, wherein the adjustable terminal protection circuit including: one or more trimming circuits configured for adjusting the adjustable terminal protection circuit;

S204: adjusting each of the adjustable terminal protection circuits by cutting off one or more fuse elements in the one or more trimming circuits of the terminal protection circuit, the trimming circuits may be one of or a combination of the trimming circuits as illustrate in FIGS. 4-10.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. A wafer for facilitating wafer-level adjustment of protection circuits of electronic devices, the wafer comprising a plurality of adjustable electronic devices, each adjustable electronic device comprising:
   a control terminal; a first conduction terminal; a second conduction terminal;
   a primary component having a control electrode connected to the control terminal, a first conduction electrode connected to the first conduction terminal and a second conduction electrode connected to the second conduction terminal; and
   an adjustable terminal protection circuit configured for protecting the primary component, including:
      one or more current sampling elements connected in series between an interconnection node and the second conduction terminal;
      one or more clamping elements connected in series between the control terminal and the interconnection node;
      one or more discharge elements, each having a control electrode connected to the interconnection node, a first conduction electrode connected to the control terminal and a second conduction electrode connected to the second conduction terminal; and
      one or more trimming circuits, each configured for adjusting the adjustable terminal protection circuit.

2. The wafer according to claim 1, wherein the trimming circuits comprise at least one current sampling element activation circuit configured for activating a corresponding current sampling element.

3. The wafer according to claim 2, wherein the at least one current sampling element activation circuit includes a fuse element connected in parallel with the corresponding current sampling element, and the fuse element has a first end connected to a first trimming pad and a second end connected to the second conduction terminal.

4. The wafer according to claim 2, wherein the at least one current sampling element activation circuit includes:
   a controllable switching element connected in parallel with the corresponding current sampling element;
   a pulling-up fuse element connected between the control terminal and a control electrode of the controllable switching element, the pulling-up fuse element having a first end connected to the control terminal and a second end connected to a trimming pad; and
   a pulling-down resistive element connected between the control electrode of the controllable switching element and the second conduction terminal.

5. The wafer according to claim 2, wherein the at least one current sampling element activation circuit includes:
   a controllable switching element connected in parallel with the corresponding current sampling element;
   a pulling-up fuse element connected between a first electrode of a clamping element and a control electrode of the controllable switching element, the pulling-up fuse element having a first end connected to a first trimming pad and a second end connected to a second trimming pad; and
   a pulling-down resistive element connected between the control electrode of the controllable switching element and the second conduction terminal.

6. The wafer according to claim 1, wherein the trimming circuits comprise at least one current sampling element deactivation circuit configured for deactivating a corresponding current sampling element.

7. The wafer according to claim 6, wherein the at least one current sampling element deactivation circuit includes:
- a controllable switching element connected in parallel with the corresponding current sampling element;
- a pulling-up resistive element connected between the control terminal and a control electrode of the controllable switching element; and
- a pulling-down fuse element connected between the control electrode of the controllable switching element and the second conduction terminal, the pulling-down fuse element having a first end connected to a trimming pad and a second end connected to the second conduction terminal.

8. The wafer according to claim 1, wherein the trimming circuits comprise at least one clamping element activation circuit configured for activating a corresponding clamping element.

9. The wafer according to claim 8, wherein the at least one clamping element activation circuit includes a fuse element connected in parallel with the corresponding clamping element, and the fuse element has a first end connected to a first trimming pad and a second end connected to the second conduction terminal.

10. The wafer according to claim 8, wherein the at least one clamping element activation circuit includes:
- a controllable switching element connected in parallel with the corresponding clamping element;
- a pulling-up fuse element connected between the control terminal and a control electrode of the controllable switching element, the pulling-up fuse element having a first end connected to the control terminal and a second end connected to a trimming pad; and
- a pulling-down resistive element connected between the control electrode of the controllable switching element and the second conduction terminal.

11. The wafer according to claim 1, wherein the trimming circuits comprise at least one clamping element deactivation circuit configured for deactivating a corresponding clamping element.

12. The wafer according to claim 11, wherein the at least one clamping element deactivation circuit includes:
- a controllable switching element connected in parallel with the corresponding clamping element;
- a pulling-up resistive element connected between the control terminal and a control electrode of the controllable switching element; and
- a pulling-down fuse element connected between the control electrode of the controllable switching element and the second conduction terminal, the pulling-down fuse element having a first end connected to a trimming pad and a second end connected to the second conduction terminal.

13. The wafer according to claim 1, wherein the trimming circuits comprise at least one discharge element activation circuit configured for activating a corresponding discharge element.

14. The wafer according to claim 13, wherein the at least one discharge element activation circuit includes:
- a pulling-up fuse element having a first end connected to the interconnection node and a second end connected to a control electrode of the corresponding discharge element, the first end of the pulling-up fuse element being connected to a first trimming pad; and the second end of the pulling-up fuse element being connected to a second trimming pad; and
- a pulling-down resistive element having a first end connected to the control electrode of the corresponding discharge element and a second end connected to the second conduction terminal.

15. The wafer according to claim 13, wherein the at least one discharge element activation circuit includes:
- a controllable switching element having a first conduction electrode connected to the interconnection node and a second conduction electrode connected to a control electrode of the corresponding discharge element;
- a pulling-up fuse element connected between the control terminal and a control electrode of the controllable switching element, the pulling-up fuse element having a first end connected to the control terminal and a second end connected to a trimming pad; and
- a pulling-down resistive element connected between the control electrode of the controllable switching element and the second conduction terminal.

16. The wafer according to claim 1, wherein the trimming circuits comprise at least one discharge element deactivation circuit configured for deactivating a corresponding discharge element.

17. The wafer according to claim 16, wherein the at least one discharge element deactivation circuit includes:
- a controllable switching element having a first conduction electrode connected to the interconnection node and a second conduction electrode connected to a control electrode of the corresponding discharge element;
- a pulling-up resistive element connected between the control terminal and a control electrode of the controllable switching element; and
- a pulling-down fuse element connected between the control electrode of the controllable switching element and the second conduction terminal, the pulling-down fuse element having a first end connected to a trimming pad and a second end connected to the second conduction terminal.

18. A method for wafer-level adjustment of protection circuits of electronic devices in a wafer, comprising:
- fabricating an adjustable terminal protection circuit for each of the electronic devices in a wafer, wherein each of the adjustable terminal protection circuits including one or more trimming circuits configured for adjusting the adjustable terminal protection circuit; and
- adjusting each of the adjustable terminal protection circuits by cutting off one or more fuse elements in the one or more trimming circuits of the terminal protection circuit;
- wherein each of the adjustable terminal protection circuits further include one or more current sampling elements, one or more clamping elements, and one or more discharge elements;
- wherein one or more trimming circuits include:
  - at least one current sampling trimming circuit including one or more current sampling element activation circuit configured for activating a corresponding current sampling element; and/or one or more current sampling element deactivation circuit configured for deactivating a corresponding current sampling element;
  - at least one clamping trimming circuit including one or more clamping element activation circuit configured for activating a corresponding clamping element; and/or one or more clamping element deactivation circuit configured for deactivating a corresponding clamping element; and/or
  - at least one discharge trimming circuit including one or more discharge element activation circuit configured for activating a corresponding discharge element;

and/or one or more discharge element deactivation circuit configured for deactivating a corresponding discharge element.

* * * * *